United States Patent
Martin et al.

(10) Patent No.: US 6,841,991 B2
(45) Date of Patent: Jan. 11, 2005

(54) PLANARITY DIAGNOSTIC SYSTEM, E.G., FOR MICROELECTRONIC COMPONENT TEST SYSTEMS

(75) Inventors: Michael H. Martin, Middleton, ID (US); Brett Crump, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 10/230,615

(22) Filed: Aug. 29, 2002

(65) Prior Publication Data

US 2004/0041556 A1 Mar. 4, 2004

(51) Int. Cl.⁷ .............................................. G01R 31/02
(52) U.S. Cl. ................................................... 324/158.1
(58) Field of Search ................................ 324/758, 756, 324/757, 158.1, 73.1; 33/533, 645

(56) References Cited

U.S. PATENT DOCUMENTS

| | | | | |
|---|---|---|---|---|
| 4,751,457 A | * | 6/1988 | Veenendaal | 324/758 |
| 4,918,374 A | * | 4/1990 | Stewart et al. | 324/758 |
| 5,065,092 A | * | 11/1991 | Sigler | 324/758 |
| 5,069,002 A | | 12/1991 | Sandhu et al. | 51/165 R |
| 5,081,796 A | | 1/1992 | Schultz | 51/165.74 |
| 5,232,875 A | | 8/1993 | Tuttle et al. | 437/225 |
| 5,234,867 A | | 8/1993 | Schultz et al. | 437/225 |
| 5,240,552 A | | 8/1993 | Yu et al. | 156/636 |
| 5,244,534 A | | 9/1993 | Yu et al. | 156/636 |
| 5,245,790 A | | 9/1993 | Jerbic | 51/121 |
| 5,245,796 A | | 9/1993 | Miller et al. | 51/283 R |
| 5,421,769 A | | 6/1995 | Schultz et al. | 451/287 |
| 5,433,651 A | | 7/1995 | Lustig et al. | 451/6 |
| 5,449,314 A | | 9/1995 | Meikle et al. | 451/41 |

(List continued on next page.)

OTHER PUBLICATIONS

KLA–Tencor Corporation, P–15 Profiler Product Overview, 2 pages, http://www.kla–tencor.com/Cdownload/pdfs/ParametricP–15.pdf (accessed Aug. 8, 2002), Copyright 2001.

Applied Precision, Inc., Advanced Maintenance Manual, PrecisionPoint $V_2$ and $VX_2$ Systems, Chapter 5, Calibrations, pp. 5–73–5–79, Copyright 2000, Issaquah, Washington.

Applied Precision, Inc., Hardware Manual, PrecisionPoint $VX_2$ and PrecisionPoint $VX_2$ Extension Systems, PrecisionPoint 8.0, Chapter 5, Calibrations, pp. 58–68, Copyright 2000, Issaquah, Washington.

Applied Precision, LLC, PrecisionPoint Motherboards, 2 pages, http://www.api.com/products/semi/motherboards_main.html (accessed Aug. 8, 2002), Copyright 2001–2002.

Langfischer, H., Wafer Prober Measurement and Characterization, 2 pages, Vienna University of Technology—Institute for Solid State Electronics, http://www.fke.tuwien.ac.at/silizium/Langfischer/waferprober.htm (accessed Aug. 8, 2002).

*Primary Examiner*—Vinh P. Nguyen
(74) *Attorney, Agent, or Firm*—Perkins Coie LLP

(57) ABSTRACT

Maintaining proper planarity of elements of a microelectronic component test system helps ensure reliable operation of the test system. This disclosure suggests test systems and methods for verifying planarity of, for example, a head and a support surface of a microelectronic component test system. In one exemplary method, a probe card is mounted to and electrically coupled to a head of a microelectronic component test system. The probe card has an array of probes. A contact surface of the support is moved with respect to the head and a change in contact condition of each of the probes is recorded in a first data set. The orientation of the probe card with respect to the contact surface is changed, the contact surface is moved with respect to the head again, and a change in contact condition of each of the probes is recorded in a second data set.

19 Claims, 7 Drawing Sheets

U.S. PATENT DOCUMENTS

| | | |
|---|---|---|
| 5,486,129 A | 1/1996 | Sandhu et al. ............... 451/5 |
| 5,514,245 A | 5/1996 | Doan et al. ............. 156/636.1 |
| 5,533,924 A | 7/1996 | Stroupe et al. ............ 451/286 |
| 5,540,810 A | 7/1996 | Sandhu et al. ........... 156/636.1 |
| 5,618,381 A | 4/1997 | Doan et al. ............... 438/633 |
| 5,642,056 A * | 6/1997 | Nakajima et al. ........... 324/758 |
| 5,643,060 A | 7/1997 | Sandhu et al. ............. 451/285 |
| 5,658,183 A | 8/1997 | Sandhu et al. ............... 451/5 |
| 5,658,190 A | 8/1997 | Wright et al. ............. 451/285 |
| 5,664,988 A | 9/1997 | Stroupe et al. ............. 451/41 |
| 5,679,065 A | 10/1997 | Henderson ............... 451/290 |
| 5,702,292 A | 12/1997 | Brunelli et al. ............. 451/41 |
| 5,730,642 A | 3/1998 | Sandhu et al. ............... 451/6 |
| 5,747,386 A | 5/1998 | Moore .................... 438/692 |
| 5,761,823 A | 6/1998 | Williamson, Jr. et al. |
| 5,792,709 A | 8/1998 | Robinson et al. .......... 438/692 |
| 5,795,495 A | 8/1998 | Meikle ..................... 216/88 |
| 5,807,165 A | 9/1998 | Uzoh et al. ................ 451/41 |
| 5,830,806 A | 11/1998 | Hudson et al. ............. 438/690 |
| 5,851,135 A | 12/1998 | Sandhu et al. ............... 451/5 |
| 5,868,896 A | 2/1999 | Robinson et al. .......... 156/344 |
| 5,882,248 A | 3/1999 | Wright et al. ............. 451/285 |
| 5,893,754 A | 4/1999 | Robinson et al. .......... 438/692 |
| 5,895,550 A | 4/1999 | Andreas ................... 156/345 |
| 5,934,980 A | 8/1999 | Koos et al. ................. 451/41 |
| 5,945,347 A | 8/1999 | Wright .................... 438/692 |
| 5,954,912 A | 9/1999 | Moore ..................... 156/345 |
| 5,967,030 A | 10/1999 | Blalock .................... 100/211 |
| 5,972,792 A | 10/1999 | Hudson ................... 438/691 |
| 5,980,363 A | 11/1999 | Meikle et al. ............... 451/41 |
| 5,981,396 A | 11/1999 | Robinson et al. .......... 438/692 |
| 5,994,224 A | 11/1999 | Sandhu et al. ............. 438/692 |
| 5,997,384 A | 12/1999 | Blalock .................... 451/41 |
| 6,039,633 A | 3/2000 | Chopra .................... 451/41 |
| 6,040,245 A | 3/2000 | Sandhu et al. ............. 438/692 |
| 6,043,668 A | 3/2000 | Carney |
| 6,054,015 A | 4/2000 | Brunelli et al. ............ 156/345 |
| 6,066,030 A | 5/2000 | Uzoh ........................ 451/41 |
| 6,074,286 A | 6/2000 | Ball ....................... 451/285 |
| 6,083,085 A | 7/2000 | Lankford .................. 451/56 |
| 6,110,820 A | 8/2000 | Sandhu et al. ............. 438/633 |
| 6,116,988 A | 9/2000 | Ball ......................... 451/41 |
| 6,120,354 A | 9/2000 | Koos et al. ................ 451/41 |
| 6,135,856 A | 10/2000 | Tjaden et al. ............... 451/37 |
| 6,139,402 A | 10/2000 | Moore ....................... 451/41 |
| 6,143,123 A | 11/2000 | Robinson et al. .......... 156/344 |
| 6,143,155 A | 11/2000 | Adams et al. ............... 205/87 |
| 6,152,808 A | 11/2000 | Moore ........................ 451/60 |
| 6,176,992 B1 | 1/2001 | Talieh ....................... 205/87 |
| 6,187,681 B1 | 2/2001 | Moore ...................... 438/691 |
| 6,191,037 B1 | 2/2001 | Robinson et al. ........... 438/690 |
| 6,193,588 B1 | 2/2001 | Carlson et al. ............... 451/66 |
| 6,200,901 B1 | 3/2001 | Hudson et al. ............. 438/697 |
| 6,203,404 B1 | 3/2001 | Joslyn et al. ................ 451/37 |
| 6,203,413 B1 | 3/2001 | Skrovan ..................... 451/72 |
| 6,206,756 B1 | 3/2001 | Chopra et al. ............... 451/28 |
| 6,210,257 B1 | 4/2001 | Carlson ..................... 451/56 |
| 6,213,845 B1 | 4/2001 | Elledge ....................... 451/6 |
| 6,218,316 B1 | 4/2001 | Marsh ...................... 438/780 |
| 6,227,955 B1 | 5/2001 | Custer et al. ............... 451/285 |
| 6,234,874 B1 | 5/2001 | Ball ......................... 451/41 |
| 6,234,877 B1 | 5/2001 | Koos et al. ................. 451/41 |
| 6,234,878 B1 | 5/2001 | Moore ....................... 451/41 |
| 6,237,483 B1 | 5/2001 | Blalock .................... 100/211 |
| 6,250,994 B1 | 6/2001 | Chopra et al. ............... 451/56 |
| 6,251,785 B1 | 6/2001 | Wright ..................... 438/692 |
| 6,261,151 B1 | 7/2001 | Sandhu et al. ................ 451/5 |
| 6,261,163 B1 | 7/2001 | Walker et al. .............. 451/311 |
| 6,267,650 B1 | 7/2001 | Hembree .................... 451/49 |
| 6,273,786 B1 | 8/2001 | Chopra et al. ............... 451/28 |
| 6,273,796 B1 | 8/2001 | Moore ....................... 451/56 |
| 6,276,996 B1 | 8/2001 | Chopra ...................... 451/41 |
| 6,306,012 B1 | 10/2001 | Sabde ....................... 451/41 |
| 6,306,014 B1 | 10/2001 | Walker et al. ............... 451/41 |
| 6,306,768 B1 | 10/2001 | Klein ....................... 438/693 |
| 6,312,558 B2 | 11/2001 | Moore ...................... 156/345 |
| 6,328,632 B1 | 12/2001 | Chopra ...................... 451/41 |
| 6,331,488 B1 | 12/2001 | Doan et al. ................ 438/698 |
| 6,350,180 B2 | 2/2002 | Southwick .................. 451/41 |
| 6,350,691 B1 | 2/2002 | Lankford ................... 438/692 |
| 6,352,466 B1 | 3/2002 | Moore ........................ 451/5 |
| 6,354,923 B1 | 3/2002 | Lankford .................... 451/72 |
| 6,354,930 B1 | 3/2002 | Moore ...................... 451/527 |
| 6,358,122 B1 | 3/2002 | Sabde et al. ................. 451/41 |
| 6,358,127 B1 | 3/2002 | Carlson et al. ............... 451/67 |
| 6,358,129 B2 | 3/2002 | Dow ....................... 451/285 |
| 6,359,456 B1 | 3/2002 | Hembree et al. |
| 6,361,417 B2 | 3/2002 | Walker et al. .............. 451/168 |
| 6,364,757 B2 | 4/2002 | Moore ...................... 451/530 |
| 6,368,190 B1 | 4/2002 | Easter et al. ................ 451/41 |
| 6,368,193 B1 | 4/2002 | Carlson et al. ............... 451/66 |
| 6,368,194 B1 | 4/2002 | Sharples et al. .............. 451/67 |
| 6,368,197 B2 | 4/2002 | Elledge .................... 451/296 |
| 6,496,001 B1 * | 12/2002 | Barringer et al. ......... 324/158.1 |

* cited by examiner

PLANARITY DIAGNOSTIC SYSTEM, E.G., FOR MICROELECTRONIC COMPONENT TEST SYSTEMS

BACKGROUND

The present invention provides certain improvements in microelectronic component testing. More particularly, certain embodiments of the invention provide methods and systems for verifying planarity of elements of a microelectronic component test system, e.g., a semiconductor wafer prober.

The microelectronics industry is highly competitive and most microelectronics manufacturers are highly sensitive to quality and cost considerations. Most microelectronics manufacturers require that suppliers of microelectronic components test the performance of each microelectronic component before shipment to minimize the manufacturer's product losses. Microelectronics are commonly tested by establishing temporary electrical connections between a test system and electrical terminals on the microelectronic component.

Temporary electrical connection between the test system and the terminals of the microelectronic component is conventionally established using a test card carrying a plurality of test probes. In some circumstances, the probes comprise cantilevered wire probes which are coupled to an epoxy ring or the like. The tips of the wire probes are rearranged relative to one another to position their ends in an array that matches an array of the terminals on the microelectronic component. In another conventional system, the probes of the test card may comprise pins, typically either a length of wire or a spring-biased mechanism, e.g., POGO PINS, commercially available from Pogo Industries of Kansas City, Kans., USA. Again, the ends of these pins will be arranged in an array intended to match the array of terminals on the microelectronic component.

As microelectronic components and the terminals carried by those components are made progressively smaller, it becomes increasingly difficult to insure proper contact between the probes of the test card and the terminals of the microelectronic component. Sometimes when these elements are not precisely aligned, one or more of the probes will not establish adequate contact with the intended terminal on the microelectronic component. When this data is analyzed, the test system may improperly indicate that an acceptable microelectronic component is defective. Such false rejections can be expensive and time consuming.

One factor which can affect proper alignment of the test probes with the terminals on the microelectronic component can be the relative planarity of the test card and the terminal-bearing surface of the microelectronic component. The probe tips are often intended to lie generally in a single plane. If this probe tip plane and a plane of the microelectronic component terminals are not parallel to one another, probe tips intended to contact terminals on one side of the array may be overly compressed or stressed, while terminals on the other side of the terminal array do not adequately contact the intended probes. If the microelectronic component is pushed harder against the probes, these variations in relative planarity can be overcome. Unfortunately, this can place undue stress on the microelectronic component being tested and on the test card.

DETAILED DESCRIPTION

A. Overview

Figure 1:
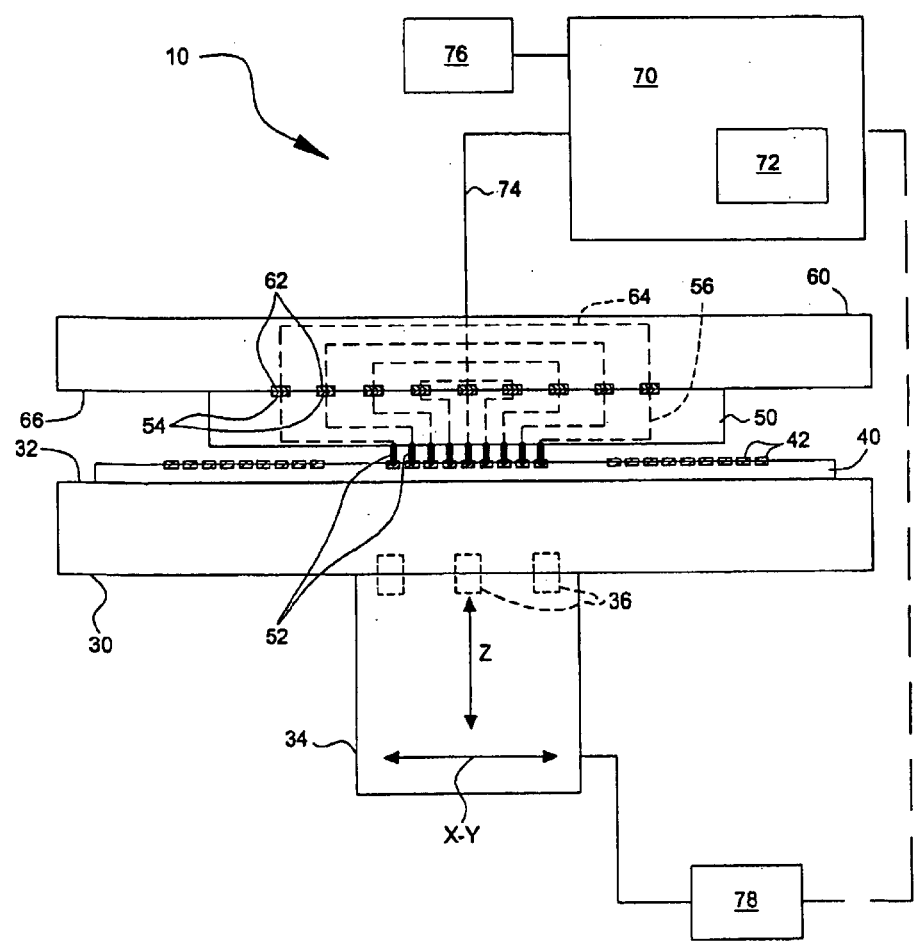
FIG. 1 is a schematic overview of a microelectronic component test system in accordance with an embodiment of the invention.

Various embodiments of the present invention provide microelectronic component test systems and methods for verifying planarity of a head which holds a test card with respect to a microelectronic component support. The term "microelectronic component" may encompass a variety of articles of manufacture, including memory modules (e.g., SIMM, DRAM, or flash memory) ASICs, processors, semiconductor wafers, semiconductor dyes singulated from such wafers, assemblies of other microelectronic components, or any of a variety of other types of microelectronic devices or components therefor. The term "probe card" or "test card" may encompass a variety of architectures, including both rigid structures and flexible structures.

In one embodiment, the present invention provides a method of using a microelectronic component test system of the type which contacts a microelectronic component carried by a microelectronic component support with a plurality of test probes on a test card carried by a head. In accordance with this particular method, a contact member is placed on the microelectronic component support. The contact member may have a conductive contact surface of known planarity. A probe card is mounted to the head such that the probe card is electrically coupled to the head and an array of probes carried by the probe card is oriented toward the contact member. The contact member may move with respect to the probe card and a changing contact condition of each of the probes with respect to the contact surface may be recorded in a first data set. An orientation of the probe card with respect to the contact member may be changed. The contact member may be moved again with respect to the probe card and a change in contact condition of each of the probes with respect to the contact surface may be recorded in a second data set.

An alternative embodiment provides a method of testing a microelectronic component which involves a) determining a planarity characteristic of a microelectronic component support of a microelectronic component test system with respect to a head of the microelectronic component test system, and b) testing the microelectronic component with the microelectronic component test system (though not necessarily in that order). The planarity characteristic may be determined by juxtaposing a diagnostic card with the microelectronic component support, thus orienting an array of diagnostic probes of the diagnostic card toward the microelectronic component support. The diagnostic probes may be electrically coupled to the head. A distance between the diagnostic card and a contact surface carried by the microelectronic component support is changed and a coordinate of the microelectronic component support at which each diagnostic probe changes a contact condition with respect to the contact surface may be recorded in a first data set. The first data set may be processed with a processor of the test system to determine at least one planarity characteristic of the microelectronic component test system. Testing the microelectronic component with the test system may include electrically coupling test probes of a microelectronic component test card to the head of the microelectronic component test system. Terminals of the microelectronic component being tested are contacted with the test probes and test data for the microelectronic component may be collected in a conventional fashion. The test data may be processed with the processor of the test system to determine at least one functional characteristic of the microelectronic component.

In accordance with another embodiment, a method is provided for verifying planarity of a microelectronic component support with respect to a head of a microelectronic component test system. This method includes juxtaposing a probe card with a contact surface that is carried by the microelectronic component support, with probes of the probe card extending toward the contact surface. A distance along a Z axis between the probe card and the contact surface is changed. A Z coordinate of the contact surface at which each probe changes a contact condition with respect to a first location on the contact surface is recorded in a first data set. The probes may then be spaced from the contact surface and at least one of the probe card and the contact surface is translated with respect to an X-Y plane. Thereafter, a distance along the Z axis between the probe card and the contact surface may be changed. A Z coordinate of the contact surface at which each probe changes a contact condition with respect to a second location on the contact surface, which is spaced from the first location, may be recorded in a second data set. The first data set and the second data set may be processed with a processor of the test system to determine a planarity characteristic.

An alternative embodiment of the invention provides a microelectronic component test system. This test system may include a head, a microelectronic component support, and a programmable processor. The head is adapted to support a diagnostic card or a test card and be electrically coupled to diagnostic probes carried by the probe card or to test probes carried by the test card. The microelectronic component support is adapted to carry a contact surface and to support a microelectronic component with respect to the head for testing. The programmable processor is operatively connected to the head to receive data from the head. The processor is programmed to record a first planarity data set corresponding to contact elevations of the diagnostic probes with a first location on the contact surface as a distance between the head and the microelectronic component support is changed. The processor is also programmed to record a second planarity data set corresponding to contact elevations of the diagnostic probes with a second location on the contact surface as a distance between the head and the microelectronic component support is changed; the first location is spaced from the second location. The processor is also programmed to compare the first data set and the second data set to determine at least one planarity characteristic of the microelectronic component test system. The processor also may be programmed to record a test data set collected with the test contacts in electrical contact with terminals of a microelectronic component and to process the test data set to determine at least one functional characteristic of the microelectronic component.

The operation and features of microelectronic component test systems and methods in accordance with embodiments of the invention are best understood in light of the environment and equipment in which they can be used. Hence, one embodiment of a microelectronic component testing system which can be used in accordance with selected methods of the invention is initially described with reference to FIG. 1. The details and features of several embodiments of diagnostic components and methods for verifying planarity are then described with reference to FIGS. 2–8.

B. Selected Embodiments of Microelectronic Component Test Systems

FIG. 1 schematically illustrates a microelectronic component test system 10 that may be used to test a microelectronic component 40. The microelectronic component test system 10 generally includes a microelectronic support 30 that supports a microelectronic component 40 with respect to a test card 50, which is supported by a head 60. The microelectronic support 30 includes a generally flat, planar surface 32 and an actuator 34 for controllably moving the support surface 32 with respect to the head 60. The actuator 34 is adapted to move the support surface 32 along a Z axis to bring the microelectronic component 40 into electrical contact with the test card 50. The actuator 34 is also adapted to move the support surface 32 transversely with respect to the Z axis and the head 60. As indicated by arrow X-Y, this may comprise movement in a plane which is generally perpendicular to the Z axis. (In the orientation shown in FIG. 1, the Z axis is vertical and the X-Y plane is horizontal, but other orientations are possible.)

The microelectronic support 30 may also include adjustment screws 36 (shown schematically) or the like which can be used to alter the orientation of the support surface 32 with respect to the Z axis and/or the X-Y plane. In one embodiment, these adjustment screws 36 may comprise three or more finely threaded screws received in corresponding internally threaded holes carried by the upper element of the microelectronic support 30. As is known in the art, the support surface 32 can be oriented perpendicular to the Z axis (horizontally in FIG. 1) by appropriate adjustment of one or more of the adjustment screws 36.

The support surface 32 is adapted to support a microelectronic component 40 thereon. To facilitate stable placement of the microelectronic component 40 with respect to the support surface 32, the microelectronic support 30 may comprise a vacuum chuck. Such chucks, which are available commercially, can apply a vacuum on the back surface of the microelectronic component 40 to help hold the microelectronic component 40 in place as the actuator 34 moves the support surface 32.

The microelectronic component test system 10 also includes a test card 50 which includes a plurality of test probes 52 positioned to contact terminals 42 on the microelectronic component 40. As shown in FIG. 1, when the test card 50 is juxtaposed with the microelectronic component 40 and the support surface 32, the test probes 52 extend downwardly in a Z direction toward the terminals 42. The test probes 52 may be of any desired type. In one embodiment, the test probes 52 comprise wire pins or POGO PINS. In other embodiments, the test probes 52 may comprise cantilevered wires or the like.

Each of the test probes 52 may be electrically coupled to a test contact 54 by circuitry 56 (shown schematically). These test contacts 54 are arranged in an array which matches an array of head contacts 62 carried by the head 60, permitting a wide variety of probe configurations to be coupled to the head contacts 62, which may have a fixed position in the head 60. This facilitates exchanging the test card 50 with a test card having a different probe arrangement to test different microelectronic component configurations.

It should be recognized that FIG. 1 is a stylized, schematic representation of the interface between the test card 50 and the head 60. In many circumstances, the back of the test card 50 will not be mounted flush against and supported by a bottom head surface 66 as depicted in FIG. 1. For example, the head 60 may comprise a ring holder which has a central opening within which the test card 50 is received. Such ring holders and other suitable interfaces are well known in the art.

A controller 70 may be connected to the test probes 52. In the embodiment illustrated in FIG. 1, the controller 70 may communicate with the head contacts 62 (which, in turn, are in communication with the test probes 52 via the test contacts 54 and circuitry 56) by head circuitry 64 and a communication line 74. The controller 70 may take any of a variety of forms. In one embodiment, the controller 70 comprises a computer having a programmable processor 72. The controller 30 may be operatively coupled to a power supply 76 and control delivery of power from the power supply 76 to various components of the test card 50 via the communication line 74. In one embodiment, the actuator 34 of the microelectronic component support 30 is operated directly by the controller 70. In the illustrated embodiment, a separate actuator control 78 controls the actuator 34, but the actuator control 78 communicates with the controller 70 and is operated under the control of the controller 70.

Figure 2:
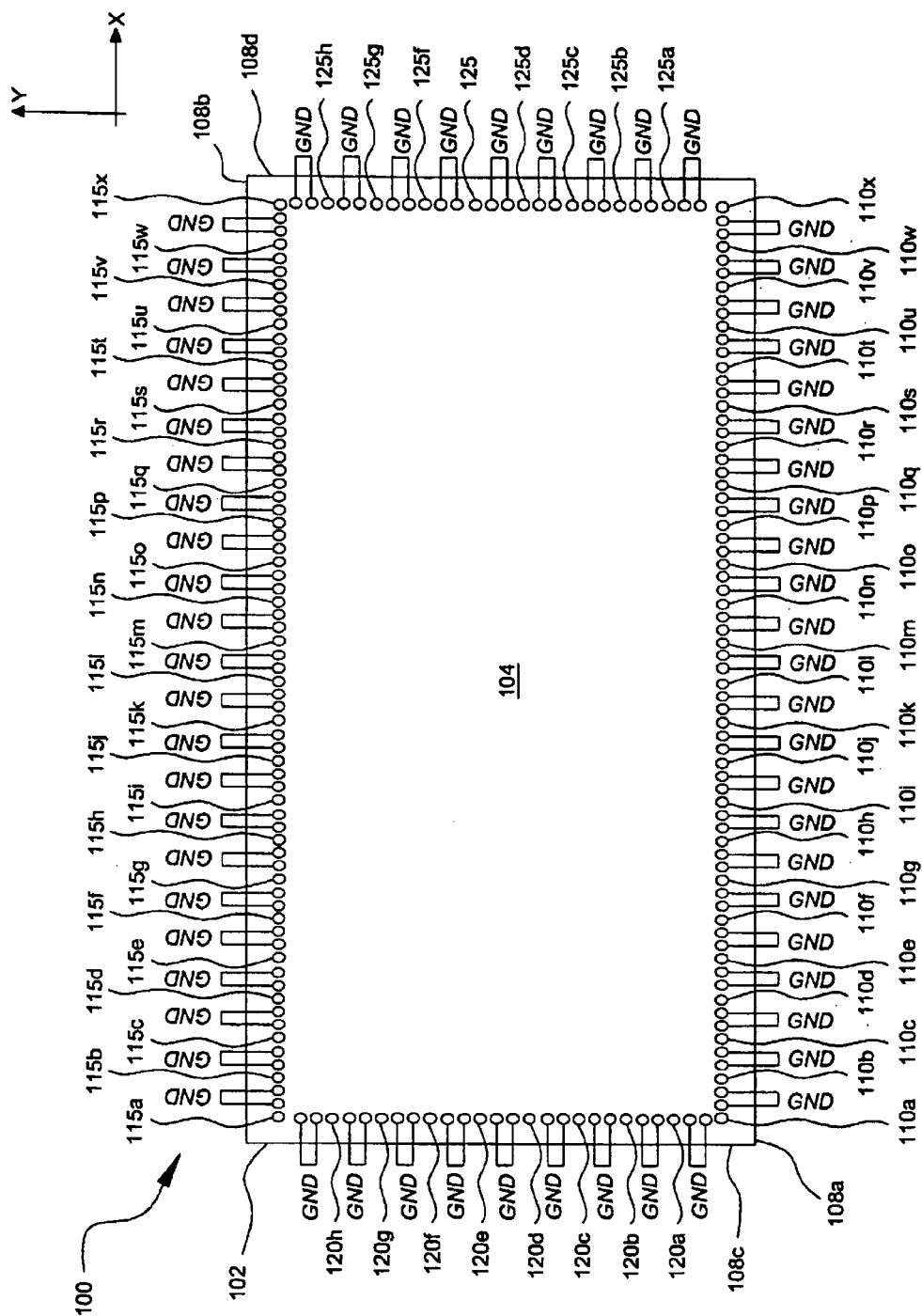
FIG. 2 is a schematic top view of a diagnostic card in accordance with one embodiment of the invention.
Figure 3:
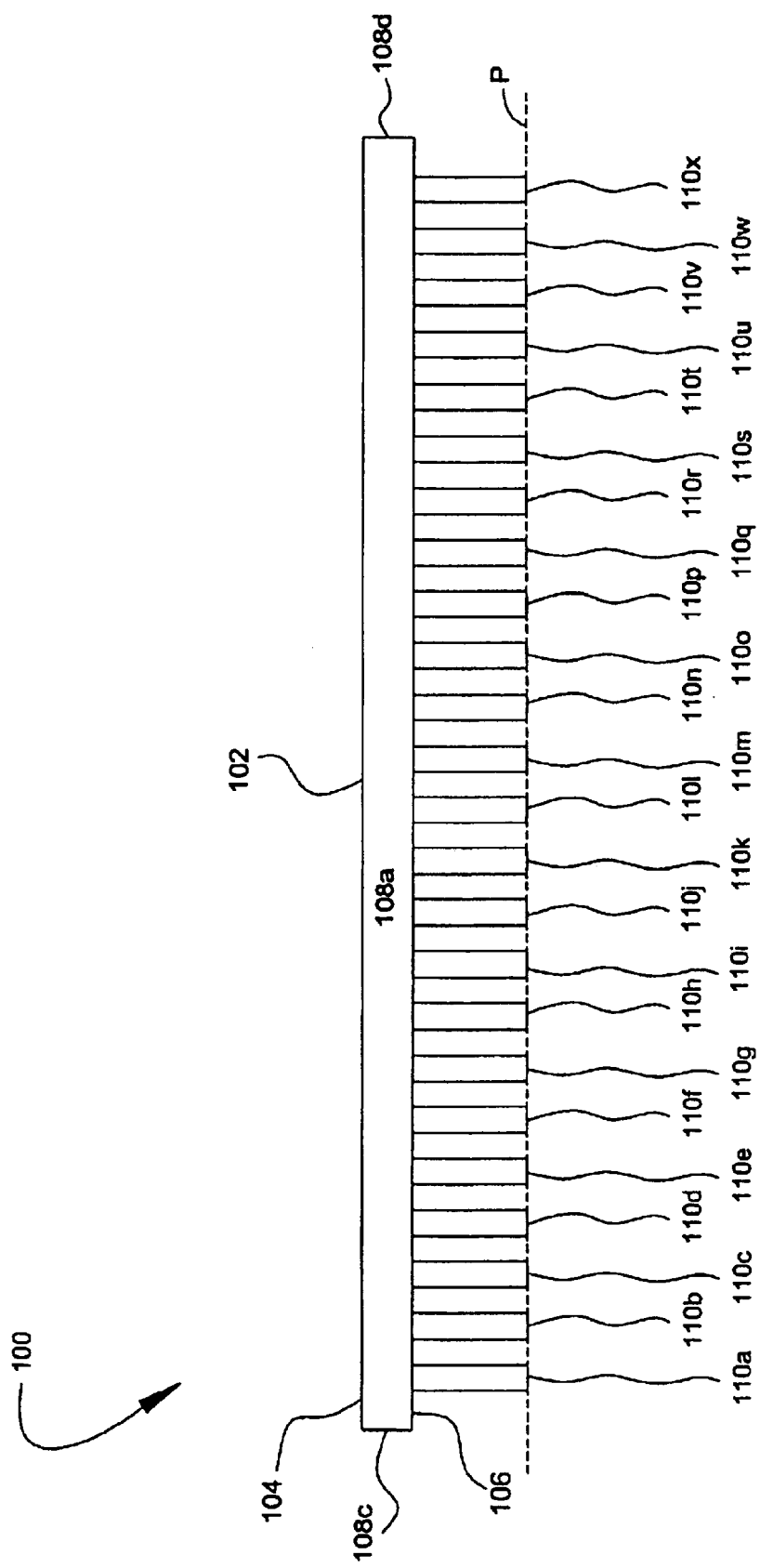
FIG. 3 is a schematic side view of the diagnostic card of FIG. 2.

C. Selected Embodiments of Diagnostic Probe Cards and Test Systems Employing Such Probe Cards FIGS. 2 and 3 schematically illustrate a diagnostic probe card 100 in accordance with one embodiment. The diagnostic probe card 100 includes a substrate 102 having a back surface 104 and a confronting surface 106. The substrate 102 is adapted to be supported by the head 60 of the test system 10 shown in FIG. 1. The substrate 102 may be formed of a variety of materials, but it preferably is formed of a relatively rigid and dimensionally stable material to maintain the relative positions of the ends of the probes carried by the substrate 102. In one embodiment, the substrate 102 has a relatively low coefficient of thermal expansion. It is anticipated that most materials used in forming a conventional test card 50 may also be useful as the substrate 102 of the diagnostic probe card 100. In one particular embodiment, the substrate 102 may comprise a ceramic or glass material.

The substrate 102 carries at least one probe 110. In one embodiment, the substrate carries a plurality of probes 110–125 arranged in an array. The array may be configured in any desired fashion. The array may include at least three probes to ascertain a plane of a contact surface of the test system 10, as described below. Using four or more probes, e.g., four spaced-apart probes positioned adjacent corners of a rectangular substrate 102, can further pinpoint the plane of the contact surface.

In the embodiment illustrated in FIGS. 2 and 3, the diagnostic probe card 100 includes two sets of X probes 110 and 115 aligned in an X direction and two lines of Y probes 120 and 125 arranged in a Y direction. With the rectangular substrate 102 shown in these Figures, a plurality of first X probes 110a–x are arranged adjacent a first edge 108a of the substrate 102. A line of second X probes 115a–x are aligned adjacent an opposite side 108b of the substrate 102. Similarly, a line of first Y probes 120a–h are aligned adjacent a third edge 108c of the substrate 102 and the line of second Y probes 125a–h are aligned adjacent an opposite fourth edge 108d of the substrate 102. If so desired, the first X-probes 110a may be aligned parallel to the line of second X probes 115 and the first Y probes 120 may be aligned parallel to the line of second Y probes 125.

The diagnostic probe card 100 shown in FIGS. 2 and 3 employs twenty-four first X probes 110, twenty-four second X probes 115, and eight each of the first Y probes 120 and the second Y probes 125. As explained below, this provides extra redundancy and allows data collected with the probe card 100 to be processed to reduce the impact of "noise" in the data.

FIG. 2 schematically illustrates a pair of ground probes (designated GND) associated with each of the probes 110–125. (For ease of understanding, these ground probes are omitted from the schematic side view of FIG. 3.) In one embodiment, one of the probes in the pair of ground probes GND is associated with a normally open channel of a relay (note shown) carried by the test head 60 and the other of the pair of ground probes GND is associated with a normally opened channel on the same relay in the head 60. As explained below, in one embodiment of the invention, the probe card 100 is first positioned in a first orientation with respect to the head 60 and is then positioned in a second orientation with respect to the head 60. In both orientations, the probes 110–125 may be positioned to be electrically coupled to the head contacts 62 of the head 60. The ground probes GND may be positioned adjacent the edges 108 of the substrate 102, generally in line with the lines of probes 110–125, as shown in FIG. 2. In another embodiment, the ground probes GND are positioned elsewhere on the substrate 102 at a location adapted to align with a corresponding head contact 62. When the probe card 100 is changed from the first orientation to the second orientation, the probes 110–125 may be aligned with an appropriate test contact. In some embodiments, though, the ground probe normally associated with the normally closed switch on the relay may be associated instead with the normally open switch and vice-versa. As a consequence, the probe 110–125 associated with the pair of ground probes GND may not be properly grounded. Switching the switch on the relay allows the probes 110–125 to be properly grounded in either orientation of the probe card 110 with respect to the head 60.

The dimensions of the probe card 100 can be varied within a relatively wide range. The probe card 100 may be a square or a non-rectangular polygon instead of the elongated rectangle shown in FIGS. 2 and 3. Conventional test cards 50 typically have the probes 52 arranged in a relatively small array adapted to contact a single microelectronic die or, perhaps, as many as four microelectronic dies. The diagnostic probe card 100 need not be so limited in size. In one embodiment, the diagnostic probe card 100 has a length in the X direction of about 2.6 inches and a length in the Y direction of about 1.1 inches.

In one embodiment, the probes 110–125 comprise conventional, commercially available spring-biased pins, such as POGO PINS, noted above. Other types of probes known in the art could be used, instead. As suggested in FIG. 3, each of the probes (only probes 110 being visible in FIG. 3) extends outwardly away from the confronting surface 106 of the substrate to a distal end spaced from the substrate. These distal ends desirably have a known relative relationship with respect to each other and to the confronting surface 106 of the substrate 102. In the illustrated embodiment, the tip of each of the probes 110 is generally aligned with a plane P of known planarity. In one embodiment, the plane P is substantially parallel to the confronting surface 106 of the substrate 102.

Figure 4:
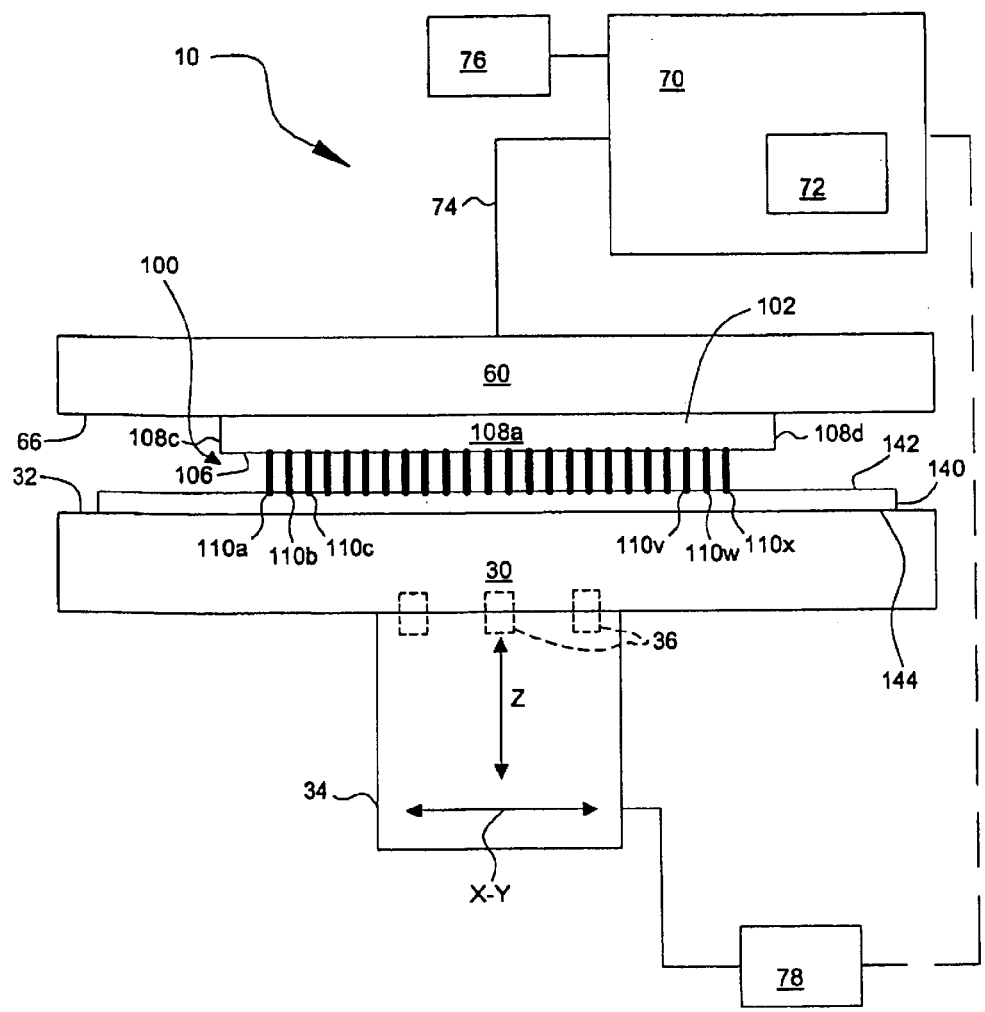
FIG. 4 is a schematic side view of the diagnostic card of FIGS. 2 and 3 in a first orientation in the test system of FIG. 1.

FIG. 4 schematically illustrates the diagnostic probe card 100 of FIGS. 2 and 3 positioned in the microelectronic component test system 10 discussed above in connection with FIG. 1. In particular, the diagnostic probe card 100 has replaced the test card 50 of FIG. 1 and the microelectronic component 40 of FIG. 1 has been replaced with a contact member 140.

As noted above, the test head 60 may have test contacts (omitted in FIG. 4 for purposes of clarity) which have fixed positions. The probe card 100 may have contacts on the back surface 104 of the substrate 102 that are positioned to contact the head contacts 62 when the probe card 100 is mounted on the test head 60. The array of head contacts 62 may have a different arrangement from the rectangular arrangement shown in FIG. 2. If so, the substrate 102 may function as a redistribution layer, including circuitry to electrically couple the probes 110–125 to appropriately positioned probe card contacts (not shown). This enables the relative planarity of the head 60 with respect to the support surface 32 of the microelectronic component support 30 to be determined without having to alter the head 60 to accommodate differences between the test card 50 and the probe card 100.

If so desired, the planarity of the test system 10 may be verified by bringing the probes 110–125 of the probe card 100 into contact with the support surface 32 of the microelectronic component support 30, as discussed below. This contact surface 32 may be somewhat irregular, though. For example, the support surface 32 may have ports formed therein to connect the backside of a microelectronic component 40 to a vacuum line to help hold the microelectronic component 40 in place. The support surface 32 may also become scratched or otherwise damaged over time as many microelectronic components 40 are tested on the test system 10.

In the illustrated embodiment, the probes 110–125 of the probe card 100 are instead brought into contact with a contact member 140 carried by the microelectronic component support 30. The contact member 140 includes a first surface 142 and a second surface 144. The first surface 142 may be oriented toward the confronting surface 106 of the probe card 100 and the head surface 66 of the head 60 and the second surface 144 may be in supportive contact with the support surface 32 of the microelectronic component support 30. In one embodiment, the first surface 142 has a known planarity. In one particular embodiment, both the first surface 142 and the second surface 144 are flat, smooth surfaces and the first and second surfaces 142 and 144 are highly parallel with respect to one another. This enables the probes 110–125 of the probe card 100 to be brought into contact with a surface which is known to be flat and has a known relationship with a plane defined by the contact surface 32 of the microelectronic component support 30.

The contact member 140 can be formed of any suitable material. Preferably, the material is dimensionally stable, relatively rigid, and hard enough to avoid undue deformation when contacted with the probes 110–125 of the diagnostic probe card 100. This will help maintain the desired degree of planarity of the first and surfaces 142 and 144 both individually and relative to one another. As explained below, the test system 10 is adapted to electrically determine a contact condition of each of the probes 110–125 with respect to the first surface 142 of the contact member 140. This can be accomplished by providing a conductive coating on the first surface 142, for example. Alternatively, the contact member 140 may be formed of a conductive material. In one embodiment, the contact member 140 is formed of a relatively rigid, conductive metal, e.g., stainless steel.

D. Methods

As noted above, embodiments of the invention provide methods of using a microelectronic component test system and/or verifying planarity of elements of microelectronic component test systems. For purposes of convenience, the following discussion explains several such methods with reference to the test system 10, diagnostic probe card 100, and other elements of FIGS. 1–4. It should be understood, however, that this is solely for purposes of illustration and the methods described below can be practiced with apparatus which differ materially from the structure shown in FIGS. 1–4.

The planarity of the component support 30 with respect to the head 60 of the test system 10 may be checked from time to time. This may be done at regular intervals, when an operator suspects a planarity problem from trends in test data collected from microelectronic components, or when initially setting up a test system, for example. When the planarity is to be checked, any test card 50 mounted to the head 60 may be removed and a diagnostic probe card 100 may be mounted to the head 60 in its place. Mounting the probe card 100 to the head 60 will juxtapose the confronting surface 106 of the probe card 100 with the support surface 32 of the microelectronic component support 30. As shown in FIG. 4, the array of probes 110–125 thus may be oriented toward the microelectronic component support 30. The probe card 100 may be physically supported by the head 60 and electrically coupled to the same head contacts 62 to which the test contacts 52 of the test card 50 were coupled.

As explained previously, the test system 10 shown in FIG. 4 may be operated by contacting the probes 110–125 of the diagnostic probe card 100 with the support surface 32 of the microelectronic component support 30. In an alternative implementation, the probes 110–125 are instead brought into contact with a surface 142 of a contact member 140. This can enhance the diagnosis of any planarity problems by using a surface 142 of known planarity, which may function as a conductive contact surface 142 for the probes 110–125, rather than the possibly irregular support surface 32. If a contact member 140 is to be used, it may be placed on the microelectronic component support 30 with its second surface 142 against the support surface 32 of the microelectronic component support 30.

With the diagnostic probe card 100 in place in the test system 10, the component support 30 may be moved with respect to the probe card 100 and the controller 70 may record a change in contact condition of each of the probes 110–125. In the embodiment illustrated in FIG. 4, moving the component support with respect to the probe card 100 may involve changing a distance between the probe card 100 and a contact surface carried by the microelectronic component support (e.g., first surface 142 of the contact member 140). Typically, when the probe card 100 is placed in the test system 10, the probes 110–125 will be spaced from the contact surface 142. In one embodiment, therefore, changing the distance between the probe card 100 and the contact surface 142 may comprise moving the microelectronic component support 30 toward the head 60 with the actuator generally along the Z axis until some or all of the probes 110–125 contact the contact surface 142. As explained immediately below, the controller 70 may detect when each of the probes 110–125 establishes contact with the contact surface 142. In another embodiment, the microelectronic component support 30 may be moved toward the head 60 until all of the probes 110–125 are in contact with the contact surface 142; if POGO PINS or the like are employed as the probes 110–125, the probes may all be compressed to some degree. The distance between the microelectronic component support and the substrate 102 of the probe card 100 may then be increased and the controller 70 may detect when each of the probes 110–125 breaks contact with the contact surface 142.

The microelectronic component support 30 may be moved along the Z axis by a stepper motor (not shown) or the like of the actuator 34. This actuator 34 may be operated by the actuator control 78 of the controller 70. The controller 70, therefore, will have information relating to a position of the support surface 32 as the microelectronic component support 30 moves along the Z axis. In one embodiment, the actuator 34 moves the support surface 34 along the Z axis in small, fixed increments, e.g., 1 µm increments, and the contact condition of each of the probes 110–125 is checked to see if the contact condition of any of the probes has changed. The Z axis position of the microelectronic component support 30 when each probe changes its contact condition (e.g., establishes electrical contact or breaks electrical contact with the contact surface 142) can be recorded in a memory of the controller 70 in a first data set.

After the first data set is recorded, the processor 72 of the controller 70 may process the first data set to determine one or more planarity characteristics. The first data set may comprise a Z axis coordinate for each of the probes 110–125 and the relative positions of the distal ends of the probes 110–125 in an X-Y direction may remain substantially constant. Hence, the first data set may define a position in three-dimensional space at which each probe 110–125 first contacted the contact surface 142. In one embodiment, the processor 172 may determine a best fit of a plane through these known positions and determine a relative planarity of the microelectronic component support surface 32 and the head 60. In another embodiment, the processor 72 may process the first data set to determine any irregularities in the contact surface 142; this can be useful, for example, if the contact member 140 is omitted and the support surface 32 of the microelectronic component support 30 functions as the contact surface. This provides a simple, automated procedure for determining the relative planarity of the microelectronic component support 30 and the head 60.

One conventional approach to measuring planarity of a conventional test system involves lifting the head of the system out of the way and running a distance gage over the support surface of the microelectronic component support. This may identify deviations in planarity of the support surface, but it will not readily identify planarity deviations of the head. Additionally, lifting the head to permit access by the distance gage often requires breaking electrical contact between the head and the test system controller. Breaking and reestablishing electrical contact may temporarily correct an intermittent electrical short without diagnosing the problem.

Embodiments which employ a diagnostic probe card 100 having contacts arranged in an array which corresponds with the array of head contacts 62 (FIG. 1) allows the diagnostic probe card 100 to be mounted to the head 60 in much the same fashion as are the test cards 50. Consequently, the first data set can be collected without unduly disturbing the orientation of the head 60 and the support 30, enhancing repeatability of the diagnostic information and extrapolation of the diagnostic information to conditions of the test system 10 with the test card 50 in place. In addition, mounting the probe card 100 to the head 60 in such embodiments can better reproduce the relative position of the test card 50 with respect to the microelectronic component support 30. This permits a determination of the relative planarity of the head 60, which carries the test card 50, and the support surface 32, which supports a microelectronic component under test 40. Conventional techniques that require lifting the head out of the way cannot readily provide such information.

Figure 5:
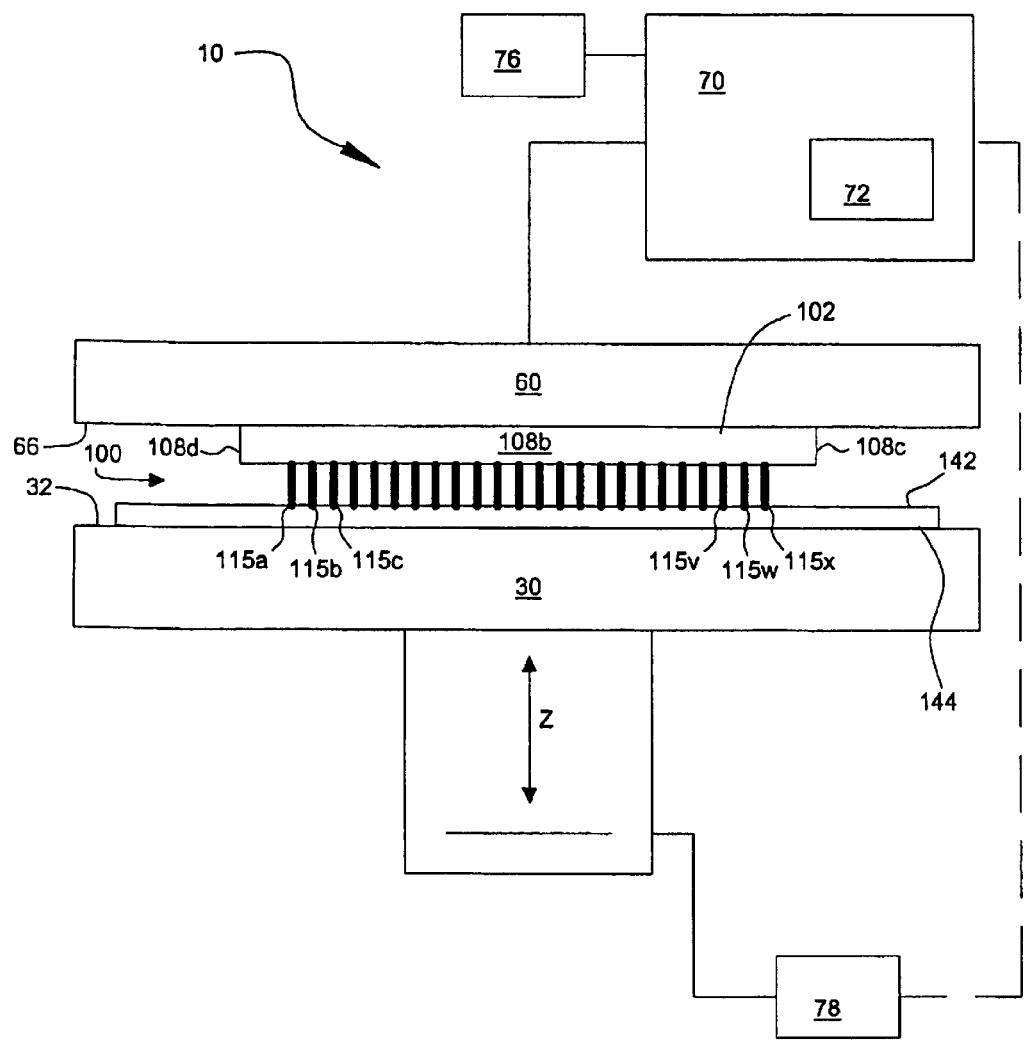
FIG. 5 is a schematic side view similar to FIG. 4, but showing the diagnostic card in a second orientation.

In another embodiment of the invention, the test system 10 is used to collect at least a second data set, with an orientation of the diagnostic probe card 100 with respect to the contact surface differing between the first and second data sets. FIG. 5 schematically illustrates one reconfiguration of the test system 10. As can be seen by comparing FIGS. 4 and 5, the probe card 100 is oriented differently in FIG. 5 than in FIG. 4. In particular, in FIG. 4 the probe card 100 is oriented in a first orientation with respect to the microelectronic component support 30 in which the first X probes 110 are in the foreground and the second X probes 115 are hidden behind the first X probes 110. In FIG. 5, which is taken from the same vantage point of the test system 10, the probe card 100 is oriented in a second orientation with respect to the microelectronic component support 30 in which the second X probes 115 are in the foreground and the first X probes 110 are hidden behind the second X probes 115.

In changing the probe card orientation from FIG. 4 to FIG. 5, the probe card 100 remains juxtaposed with the same location on the contact surface 142, i.e., the center of the contact surface 142. This can be accomplished by turning the probe card 100 180° in the X-Y plane with respect to the contact surface 142. In one embodiment, the probe card 100 is removed from the head 60, rotated 180° within a horizontal plane of the probe card 100 (i.e., a plane of the substrate 102), and remounted to the head 60 in the orientation shown in FIG. 5. As noted above, in some circumstances, this may require adjusting relays or the like to ensure that the probes 110–125 are compared to an associated grounded probe (one of the pair of contacts GND in FIG. 2). In another embodiment, the probe card 100 remains stationary and the microelectronic component support 30 is turned 180° about its axis.

Figure 6:
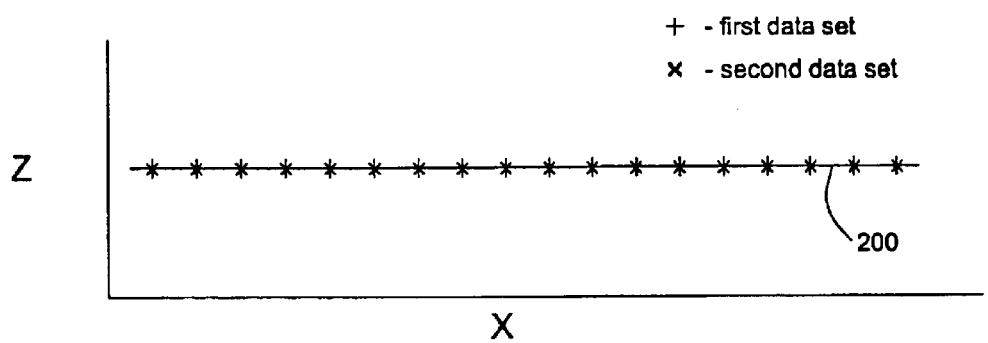
FIG. 6 is a graph schematically illustrating diagnostic test results for a test system with ideal planarity.
Figure 7:
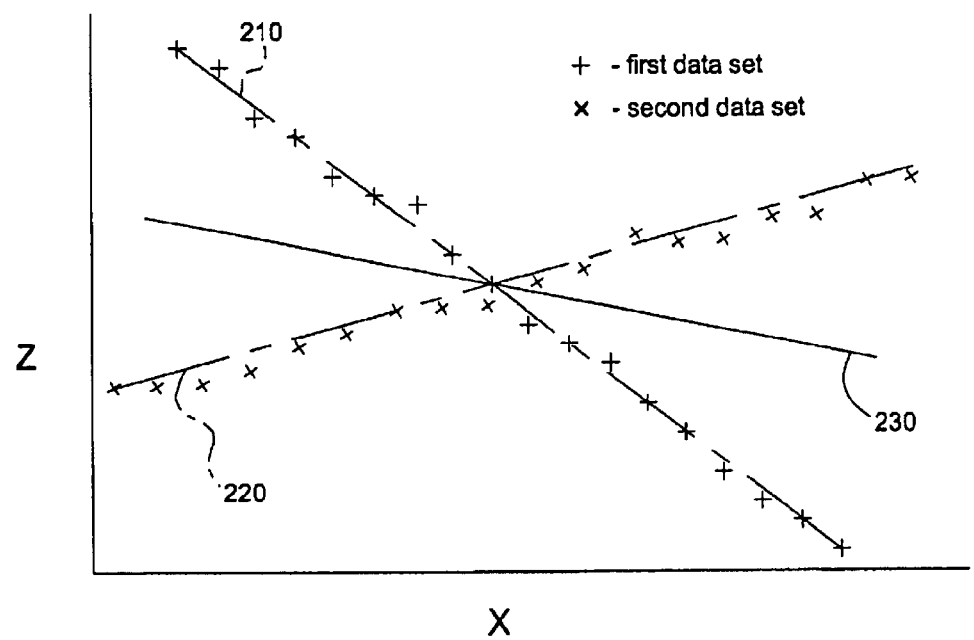
FIG. 7 is a graph schematically illustrating diagnostic test results for a test system which falls short of ideal relative planarity.
Figure 8:
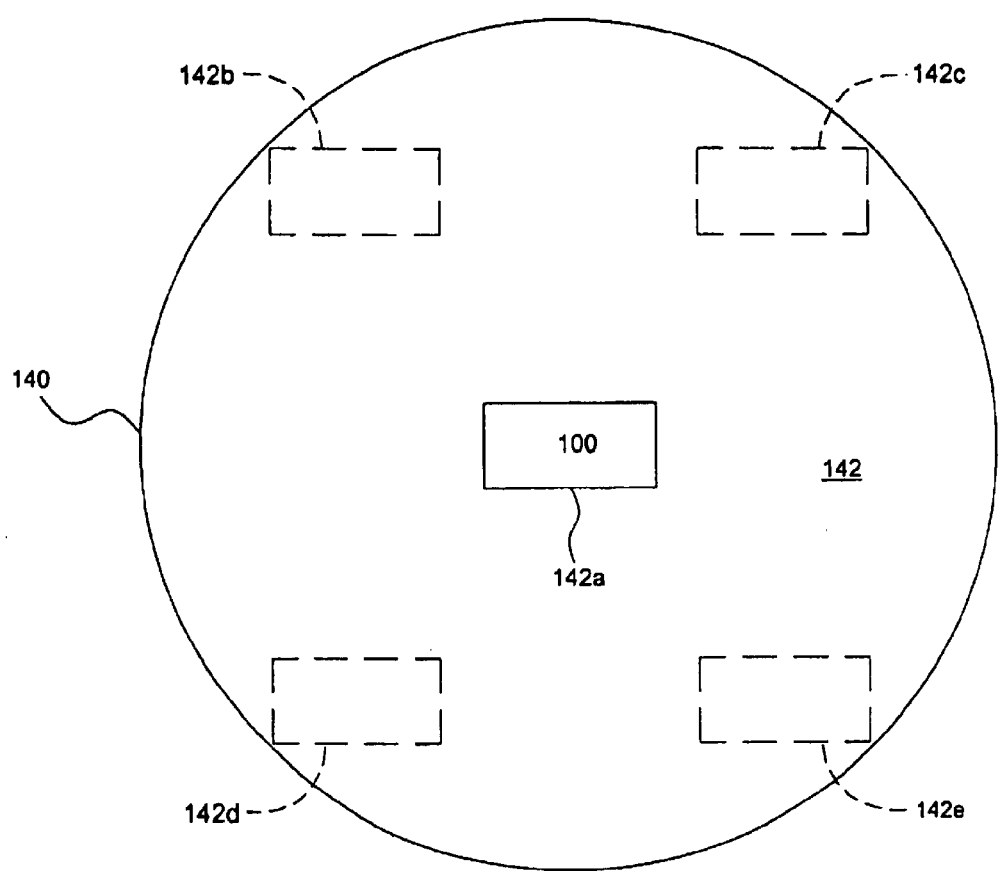
FIG. 8 is a schematic top view of the diagnostic card of FIGS. 2 and 3 juxtaposed with a contact surface of the test system of FIG. 4.

Collecting planarity data at the same location on the contact surface 142 with the probe card 100 in two different orientations enables certain planarity characteristics to be determined with better precision. FIGS. 6 and 7 schematically depict idealized data collected in this fashion. FIG. 6 illustrates the measurements anticipated for a linear array of probes (e.g., the first X probes 110) of an ideal probe card 100 with an ideally planar test system 10. The X axis represents the relative position of each of the probes 10 on the probe card and the Z axis represents a Z coordinate corresponding to a change in contact condition for each probe. The first data set is represented by plus signs and the second data set, with the probe card 100 turned 180°, is represented by Xs. In this idealized system, the Z coordinate is identical for each of the probes, regardless of the orientation of the probe card. Consequently, the line defined by this linear array of probes 110 defines a horizontal line 200. Each of the other sets of probes 115, 120, and 125 would similarly yield a horizontal line and plotting the points in three dimensions would describe a horizontal plane.

FIG. 7 schematically depicts results which may be obtained with a less idealized system. A first sloped line 210 may represent a linear regression of the first data set and a second sloped line 220 may represent a linear regression of the second data set. If the distal tips of the probes 110 were aligned in a precisely horizontal plane, each of the sloped lines 210 and 220 would have a slope which corresponds to a relative planarity of the microelectronic component support 30 with respect to the head 60. A line 230 bisecting these two sloped lines 210 and 220 would be precisely horizontal and the maximum difference between the two lines 210 and 220 (at the ends of the lines) would represent a quantitative assessment of a maximum planarity deviation. If this maximum planarity deviation is greater than a predetermined maximum, an error condition may be flagged and an error warning may be generated. In FIG. 7, the line 230 bisecting the angle between the two sloped lines 210 and 220 is also sloped. This indicates a non-linear bias of the line of probes 110. Determining the bias in this fashion allows imperfections of the probe card 100 to be identified and quantitatively factored out of the measured planarity characteristics.

FIG. 7 represents a line of data collected with the linearly aligned first X probes 110. Performing similarly analyses with the data collected from all of the probes 110–125 of the probe card 100 will provide a quantitative analysis of the relative planarity of the microelectronic component support 30 and the head 60 in three dimensions. This can be used to flag any error condition. In another embodiment, the controller 70 also gives the operator quantitative planarity data (e.g., by a graphical display) that the operator may use as a guide to adjust the microelectronic component support 30 and/or the head 60 to improve planarity of the test system.

In another embodiment of the invention, changing the orientation of the diagnostic probe card 100 with respect to the contact surface 142 may comprise moving the probe card from a first location on the contact surface 142 to a second location on the contact surface 142 spaced in an X-Y plane from the first location. As suggested in FIG. 8, the probe card 100 may be juxtaposed with a first location 142a on the contact surface and a first data set may be collected, as described above. The actuator 34 of the microelectronic component support 30 (FIGS. 1 and 4) can translate the contact surface 142 of the contact member 140 in the X-Y plane to juxtapose the probe card 100 with a second location 142b of the contact surface 142 and a second data set associated with this second location may be recorded in much the same fashion. Similarly, a third data set may be collected for a third contact surface location 142c, a fourth data set may be collected for a fourth contact surface location 142d, and a fifth data set may be collected for a fifth contact surface location 142e.

Collecting data sets with an array of probes at multiple locations enables a determination of a planarity of the head and a planarity of the support surface 32 in addition to a relative planarity measurement. If one data set describes a sloped plane, one would only know that one or both of the head 60 and the support 30 is not parallel o the X-Y plane. A mean Z coordinate value can be calculated for each of the five data sets for the five locations 142a–e. If each of these data sets describes a similarly sloped plane, but the mean Z value is substantially the same for all five data sets, this is an indication that the test head 60 is not planar with respect to the X-Y plane. Additionally, the determined slope of the plane can be used as a quantitative guide in adjusting the head 60, providing both an indication of the slope of the head 60 and an orientation of the slope to indicate which side of the head should be raised or lowered.

If each of the data sets describes a similarly sloped plane but the mean Z value differs between the five locations 142a–e, this will indicate that the support surface 32 is not parallel with the X-Y plane. Since the five data sets are collected at known locations 142a–e, the change in mean Z value between the five data sets will provide quantitative data suggesting what side of the support surface 32 should be raised or lowered and how far.

If so desired, two data sets may be collected at one or more of the five contact surface locations 142a–e, with the orientation of the probe card 100 being different for the two data sets for each site. As noted above, this can further refine the process by enabling the processor 72 to factor out any defects in the probe card 100. In one embodiment, two such data sets are collected for the first contact surface location 142a, but only a single set of data is collected for each of the other contact surface locations 142b–e.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. When the claims use the word "or" in reference to a list of two or more items, that word covers all of the following interpretations of the word: any of the items in the list, all of the items in the list and any combination of the items in the list.

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps are presented in a given order, alternative embodiments may perform steps in a different order. Aspects of the invention may also be useful in other applications outside of microelectronic component testing applications, e.g., in confirming planarity of one or more components of an atomic force microscope. The various embodiments described herein can be combined to provide further embodiments.

In general, the terms used in the following claims should not be construed to limit the invention to the specific embodiments disclosed in the specification, unless the above detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

What is claimed is:

1. A method of using a microelectronic component test system in which a microelectronic component is carried in relation to a head by a microelectronic component support, the method comprising:

placing a contact member on the microelectronic component support, the contact member having a conductive contact surface of known planarity;

mounting a probe card to the head such that the probe card is electrically coupled to the head and an array of probes is oriented toward the contact member;

moving the contact member with respect to the probe card and recording in a first data set a change in contact condition of each of the probes with respect to the contact surface;

changing an orientation of the probe card with respect to the contact member; and moving the contact member with respect to the probe card and recording in a second data set a change in contact condition of each of the probes with respect to the contact surface.

2. The method of claim 1 further comprising comparing the first data set and the second data set to quantitatively assess at least one planarity characteristic of the microelectronic component test system.

3. The method of claim 2 wherein the planarity characteristic comprises a maximum planarity deviation of the microelectronic component test system.

4. The method of claim 2 further comprising adjusting a support surface of the microelectronic component support in response to the quantitative assessment.

5. The method of claim 2 further comprising adjusting an orientation of the head in response to the quantitative assessment.

6. The method of claim 1 further comprising comparing the first data set and the second data set to determine a planarity of the microelectronic component support.

7. The method of claim 1 further comprising comparing the first data set and the second data set to determine a planarity of the head.

8. The method of claim 1 wherein the first data set comprises a position coordinate of the contact member at which each probe establishes electrical contact with the contact surface.

9. The method of claim 1 wherein the first data set comprises a position coordinate of the contact member at which each probe breaks electrical contact with the contact surface.

10. The method of claim 1 wherein moving the contact member with respect to the probe card comprises decreasing a distance between the head and the microelectronic component support and recording the change in contact condition comprises detecting a position of the contact member at which each probe establishes electrical contact with the contact surface.

11. The method of claim 1 further comprising placing all of the probes of the array in contact with the contact member before recording the change in contact condition and wherein moving the contact member with respect to the contact surface comprises increasing a distance between the head and the microelectronic component support.

12. The method of claim 11 wherein recording the change in contact condition comprises detecting a position of the contact member with respect to the head at which each probe breaks electrical contact with the contact surface.

13. The method of claim 1 wherein the probe card is mounted to the head in a first orientation and changing the orientation of the probe card comprises removing the probe card from the head and remounting the probe card to the head in a second orientation.

14. The method of claim 13 wherein the second orientation is rotated 180° within a horizontal plane of the probe card with respect to the first orientation.

15. The method of claim 1 wherein mounting the probe card comprises mounting the card with ends of the probes of the probe array arranged in a planar array.

16. The method of claim 1 wherein the probe card is electrically coupled to the head by electrically coupling the probes to head contacts carried by the head.

17. The method of claim 16 further comprising:

removing the probe card from the head;

attaching a test card to the head with test probes of the test card electrically coupled to the head; and contacting terminals of a microelectronic component with the test probes.

18. The method of claim 17 further comprising recording test data for the microelectronic component obtained via the test probes, processing the first and second data sets with a processor of the test system, and processing the test data with the processor.

19. A method of using a microelectronic component test system including a head and a support, the method comprising:

placing a contact member on the support, the contact member having a conductive contact surface;

electrically coupling a probe card to the head with an array of probes oriented toward the contact member;

moving the contact member with respect to the probe card and recording in a first data set a change in contact condition of each of the probes;

changing an orientation of the probe card with respect to the contact member;

moving the contact member with respect to the probe card and recording in a second data set a change in contact condition of each of the probes;

comparing the first and second data sets to quantitatively assess at least one planarity characteristic of the microelectronic component test system; and adjusting a support surface of the microelectronic component support in response to the quantitative assessment.

* * * * *